(12) United States Patent
Lee

(10) Patent No.: US 6,201,756 B1
(45) Date of Patent: Mar. 13, 2001

(54) SEMICONDUCTOR MEMORY DEVICE AND WRITE DATA MASKING METHOD THEREOF

(75) Inventor: Won Seok Lee, Yongin (KR)

(73) Assignee: Samsung Electronics Co., Ltd., Kyunggi-do (KR)

(*) Notice: Subject to any disclaimer, the term of this patent is extended or adjusted under 35 U.S.C. 154(b) by 0 days.

(21) Appl. No.: 09/518,313

(22) Filed: Mar. 3, 2000

(30) Foreign Application Priority Data

Jul. 15, 1999 (KR) .................................................. 99-28721

(51) Int. Cl.[7] ...................................................... G11C 7/00
(52) U.S. Cl. .................................. 365/230.04; 365/230.03
(58) Field of Search .......................... 365/230.01, 230.04, 365/230.03, 189.01, 189.04

(56) References Cited

U.S. PATENT DOCUMENTS 6,011,745 * 1/2000 Okamura ......................... 365/230.03
6,108,265 * 8/2000 Takeuchi ......................... 365/230.04

* cited by examiner

*Primary Examiner*—Terrell W. Fears
(74) *Attorney, Agent, or Firm*—Samuels, Gauthier & Stevens LLP (57) ABSTRACT

A semiconductor memory device with a write data masking method includes memory cell array divided into an even and an odd numbered memory cell array blocks for storing a first and a second data set, respectively, in response to even and odd numbered column selection signals, respectively. The device also includes an address generator for generating a column address in response to column addresses of multiple bits, an even and odd numbered column decoder for decoding the column addresses and generating the even and odd numbered column selection signals, respectively, in response to a first and a second masking control signal, respectively. A first and a second masking control signal generator latches a masking control signal in response to data strobe signals of first and second states and respectively generates a third and a fourth masking control signal, respectively, in response to a clock signal in order to generate the third and fourth masking control signals, respectively, as the first and second masking control signals, respectively and second and first masking control signals, respectively, in response to a single bit column address selected from the column addresses of multiple bits. A first and a second data generator latches the input data in response to the data strobe signals of the first and second states and generates a third and a fourth data set in response to the clock signal in order to generate the third and fourth data sets, respectively, as the first and second data sets or second and first data sets in response to the single bit column address. Therefore, the device can mask the even-numbered or the odd-numbered data orderly or reversely by using one masking control signal and column address.

12 Claims, 7 Drawing Sheets

SEMICONDUCTOR MEMORY DEVICE AND WRITE DATA MASKING METHOD THEREOF

BACKGROUND OF THE INVENTION

1. Field of the Invention

The present invention relates to a semiconductor memory device, and more particularly to a semiconductor memory device and write data masking method thereof for preventing unwanted data from being written into memory cells.

2. Description of the Related Art

The SDRAM (Synchronous DRAM) works according to externally applied clock signals and has a higher data transfer rate compared to the asynchronous DRAM. Hence, the development of the SDRAM effectively contributes to improving the operational speed of a computer system. The conventional SDRAM can transfer only a single set of data in a single clock cycle on either the rising or falling edge of the externally applied clock signal. Such conventional data transfer approaches are generally not compatible with the increasing demand for higher operational speed.

In order to resolve such problems there exists another kind of SDRAM that performs the data input and output operations at both the rising and falling edges of a data strobe signal whose period is the same as that of the clock signal in data read and write operations. This device can therefore perform two data input and output operations in one clock period, and is therefore commonly referred to as a double data rate (DDR) SDRAM. Namely, the DDR SDRAM has double the data transfer rate of the conventional SDRAM, which makes it relatively suited for use in advanced computer systems.

The DDR SDRAM is different from the conventional SDRAM in the construction of the memory cell array and in the data access method it uses. In particular, in the DDR SDRAM, the memory cell array block consists of an even numbered memory cell array block and an odd numbered memory cell array block. The memory cells of the even numbered memory cell array block are accessed by even numbered column selection signals generated by an even numbered column decoder. Similarly, the memory cells of the odd numbered memory cell array block are accessed by the odd numbered column selection signals generated by an odd numbered column decoder. Hence, the DDR SDRAM inputs two sets of data in one clock cycle in response to the data strobe signal, and the two sets of data are simultaneously written into the memory cells of the even and odd numbered memory cell array blocks, which are simultaneously accessed by even and odd numbered column selection signals, respectively, generated by the even and odd numbered column decoders.

The DDR SDRAM has a write data masking function for preventing unwanted data from being written into the even and/or odd numbered memory cell arrays. The masking control signals are supplied through two pins provided in the DDR SDRAM. Furthermore, the conventional DDR SDRAM is designed such that the even numbered data may be written only into the even numbered memory cell array block, and the odd numbered data only into the odd numbered memory cell array block. That is, the even numbered data may not be written into the odd numbered memory cell array block, and the odd numbered data may not be written into the even numbered memory cell array block.

SUMMARY OF THE INVENTION

It is an object of the present invention to provide a semiconductor memory device which can mask even numbered and odd numbered write data using one masking control signal.

According to an aspect of the present invention, a semiconductor memory device comprises a memory cell array having even and an odd numbered memory cell array blocks for storing a first and a second data set, respectively, in response to respective even and odd numbered column selection signals, an address generator for generating a column address in response to column addresses of multiple bits, an even and odd numbered column decoder for decoding the column addresses to respectively generate the even and odd numbered column selection signals according to a first and a second masking control signal, a first and a second masking control signal generator for latching a masking control signal in response to data strobe signals of first and second states, respectively, and generating a third and a fourth masking control signal, respectively, in response to a clock signal, in order to generate the third and fourth masking control signals, respectively, as the first and second masking control signals or second and first masking control signals in response to a single bit column address selected from the column addresses of multiple bits, and a first and a second data generator for latching the input data in response to the data strobe signals of the first and second states, respectively, and generating a third and a fourth data set, respectively, in response to the clock signal in order to generate the third and fourth data, respectively, as the first and second data or second and first data in response to the single bit column address.

According to another aspect of the present invention, a method for masking memory cells from writing unwanted data is provided for a semiconductor memory device, which comprises a memory cell array having even and an odd numbered memory cell array blocks for storing a first and a second data according to respective even and odd numbered column selection signals, an address generator for generating column address in response to column address of multiple bits, and an even and an odd numbered column decoder for decoding the column address and generating the even and odd numbered column selection signals in response to a first and a second masking control signals. The method comprises the steps of receiving a masking control signal in response to the data strobe signal of a first state or a second state and respectively generating a third or fourth masking control signal in response to a clock signal while receiving the input data in response to the data strobe signal of the first or second state to respectively generate a third or fourth data in response to the clock signal, and generating the third and fourth masking control signals respectively as the first and second or second and first masking control signals in response to the column address while generating the third and fourth data, respectively, as the first and second or second and first data in response to the column address.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1:
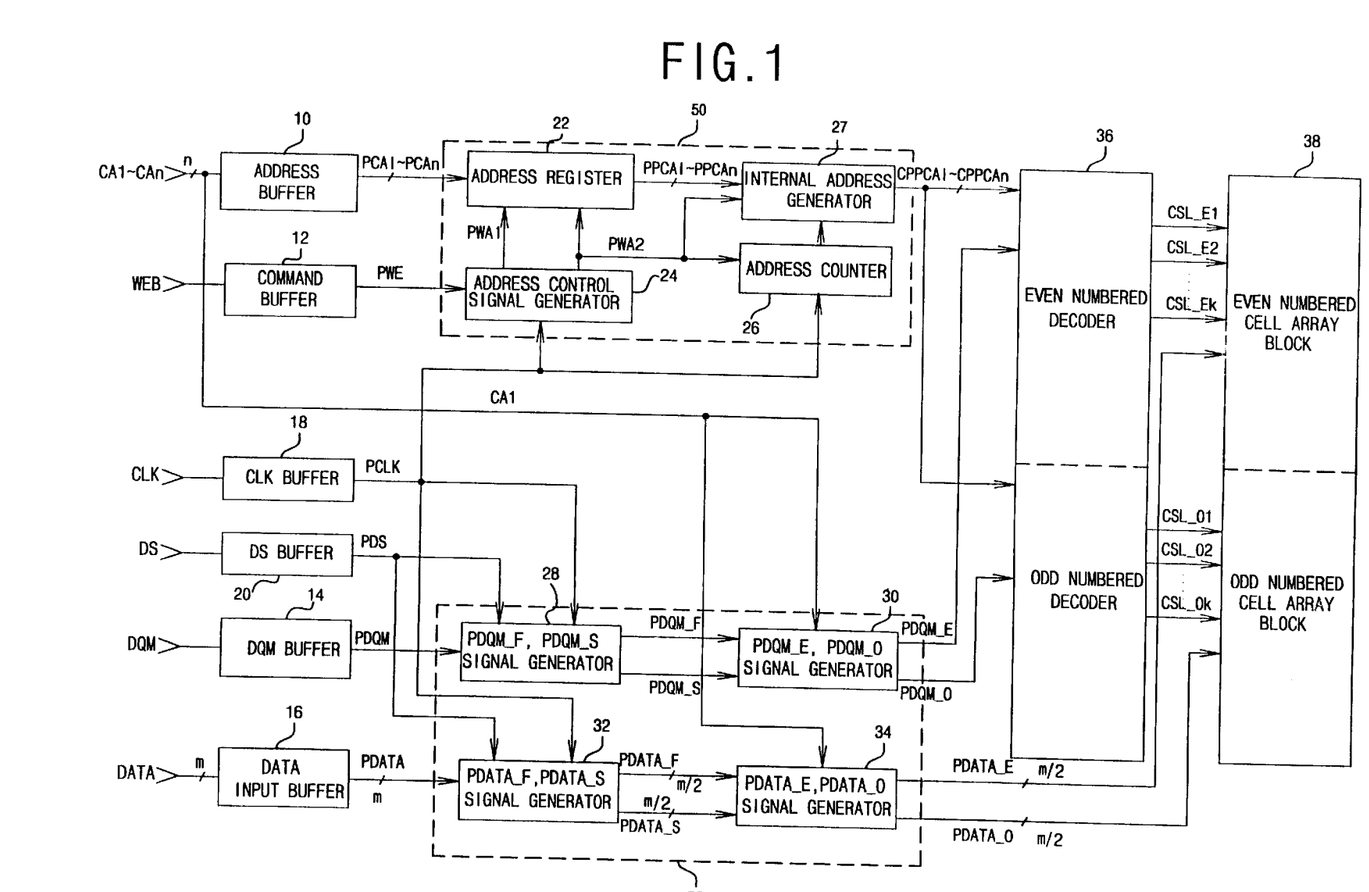
FIG. 1 is a schematic block diagram illustrating one embodiment of a semiconductor memory device according to the present invention.

Referring to FIG. 1, a semiconductor memory device includes an address buffer 10, command buffer 12, DQM buffer 14, DATA input buffer 16, CLK buffer 18, DS buffer 20, address generator 50, DQM and DATA control circuit 52, column decoder 36, and memory cell array block 38. The address generator 50 includes an address register 22, address control signal generator 24, address counter 26, and internal address generator 27. The DQM and DATA control circuit 52 includes PDQM_F, PDQM_S signal generator 28, PDQM_E, PDQM_O signal generator 30, PDATA_F, PDATA_S signal generator 32, and PDATA_E/PDATA_O signal generator 34. The column decoder 36 includes an even numbered decoder for generating column selection signals CSL_E1, CSL_E2, . . . , CSL_Ek for selecting the column selection signal lines of the even numbered memory cell array block of the memory cell array block 38, and an odd numbered decoder for generating column selection signals CSL_O1, CSL_O2, . . . , CSL_Ok for selecting the column selection signal lines of the odd numbered memory cell array block of the memory cell array block 38. The memory cell array block 38 comprises the even numbered memory cell array block and odd numbered memory cell array block.

The operation of the various circuits in FIG. 1 will now be described in detail. The buffers 10, 12, 14, 16, 18, 20 temporarily store an externally inputted address CA1~CAn, an inverted write command WEB, a masking control signal DQM, a data signal DATA, a clock signal CLK, and data strobe signal DS, respectively. The buffers 10, 12, 14, 16, 18, 20 generate buffered address signals PCA1~PCAn, an inverted write command PWE, a masking control signal PDQM, data PDATA, a clock signal PCLK, and a data strobe signal PDS, respectively. The address register 22 latches the address PCA1~PCAn in response to a control signal PWA1 and transfers the latched address PCA1~PCAn as the first internal address PPCA1~PPCAn to the internal address generator 27 in response to a control signal PWA2.

The address counter 26 is reset in response to the control signal PWA2 and generates a counted value by counting by burst length in response to the clock signal PCLK. That is, when burst length is 8, the address counter 26 generates 3 counted values in response to the clock signal PCLK. And when the burst length is 16, it generates 7 counted values in response to the clock signal PCLK. The internal address generator 27 outputs the first address PPCA1~PPCAn outputted from the address register 22 as an address CPPCA1~CPPCAn in response to the control signal PWA2. After the control signal PWA2 is generated, the internal address generator 27 combines the address CPPCA1~CPPCAn and the counted values provided from the address counter 26, and generates a burst column address CPPCA1~CPPCAn.

Figure 2:
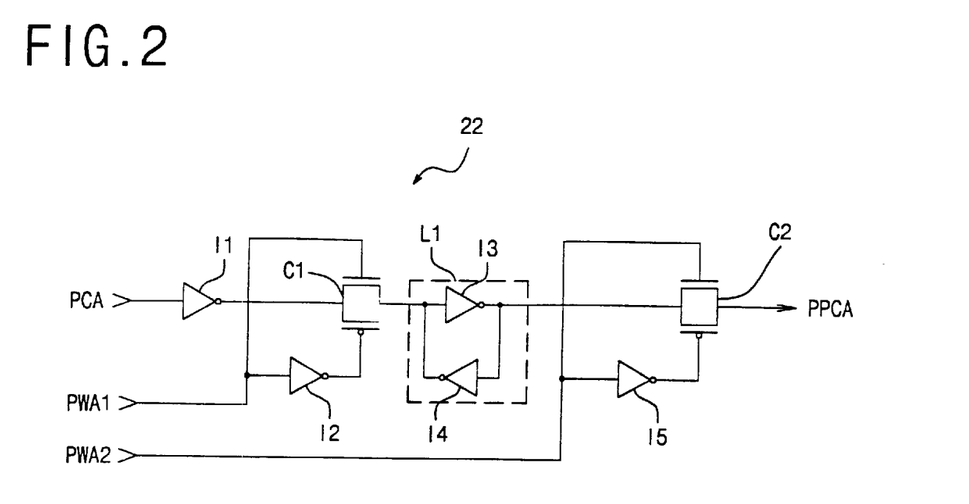
FIG. 2 is a schematic circuit diagram illustrating one embodiment of an address register as shown in FIG. 1.

The address control signal generator 24 latches the signal PWE and generates the control signal PWA1. The address control signal generator 24 delays the control signal PWA1 and generates the control signal PWA2 in response to the clock signal PCLK. The time of generating the control signal PWA2 is adjusted to the time of generating the data PDATA_E, PDATA_O. The PDQM_F, PDQM_S signal generator 28 latches the masking control signal PDQM in response to the data strobe signal PDS and generates the masking control signal PDQM_F or PDQM_S in response to the clock signal PCLK according to whether the masking control signal PDQM is inputted at low or high level of the data strobe signal PDS. The PDQM_E, PDQM_O signal generator 30 generates the masking control signal PDQM_E or PDQM_O to mask data inputted to the even or odd numbered memory cell array block in response to the column address CA1.

The PDATA_F, PDATA_S signal generator 32 latches the input data PDATA in response to the data strobe signal PDS and generates the data signal PDATA_F or PDATA_S in response to the clock signal PCLK according to whether the input data is inputted at a low or high level of the data strobe signal PDS. The PDATA_E, PDATA_O signal generator 34 transfers the data DATA_F and DATA_S as the data PDATA_E, PDATA_O, respectively, to the even and odd numbered memory cell array blocks, respectively, in response to the column address CA1. The column decoder 36 decodes the address CPPCA1-CPPCAn generated from the internal address generator 27 and generates the even numbered column selection signals CSL_E1, CSL_E2, . . . , CSL_Ek and the odd numbered column selection signals CSL_O1, CSL_O2, . . . , CSL_Ok in response to the control signals PDQM_E and PDQM_O, respectively. The memory cell array block 38 writes the data PDATA_E and PDATA_O into selected memory cells in response to the column selection signals CSL_E1, CSL_E2, . . . , CSL_Ek and CSL_O1, CSL_O2, . . . , CSL_Ok. That is, the data PDATA_E is written into the even numbered memory cell array block in response to the column selection signals CSL_E1, CSL_E2, . . . , CSL_Ek, and the data PDATA_O is written into the odd numbered memory cell array block in response to the column selection signals CSL_O1, CSL_O2, . . . , CSL_Ok.

FIG. 2 contains a schematic block diagram of one embodiment of the address register 22 of FIG. 1. The address generator 22 includes CMOS transmission gates C1, C2, latch L1 made of inverters I3 and I4, and inverters I1, I2, I5. The inverter I1 inverts the address PCA. The CMOS transmission gate C1 transfers the output signal of the inverter I1 in response to the control signal PWA1 having a high level. The CMOS transmission gate C2 transfers the output signal of the latch L1 as the data PPCA in response to the control signal PWA2 at a high level. The address register 22 as shown in FIG. 2 latches the input address PCA in response to the control signal PWA1 and transfers it as the address PPCA in response to the control signal PWA2.

Figure 3:
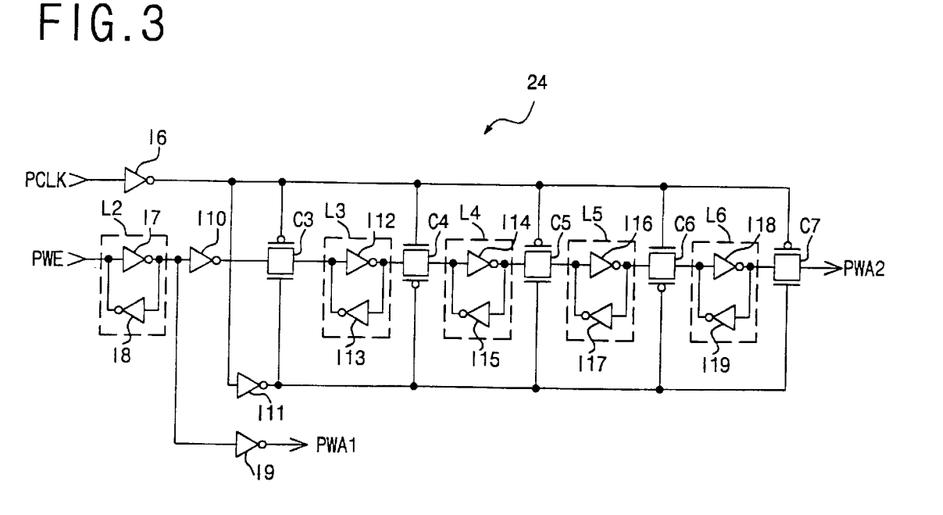
FIG. 3 is a schematic circuit diagram illustrating one embodiment of an address control signal generator as, shown in FIG. 1.

FIG. 3 contains a schematic block diagram of one embodiment of the address control signal generator 24 of FIG. 1. The address control signal generator 24 includes a plurality of inverters I6, I9, I10, I11, a latch L2 composed of inverters I7 and I8, a latch L3 of inverters I12 and I13, a latch L4 of inverters I14 and I15, a latch L5 of inverter I16 and I17, a latch L6 of inverters I18 and I19, and CMOS transmission gates C3, C4, C5, C6, C7. The latch L2 inverts and latches the write command signal PWE. The inverter I9 inverts the output signal of the latch L2 and generates the control signal PWA1, and then the latch L1 of the address register 22 (see FIG. 2) latches the external address. The inverter I10 inverts the output signal of the latch L2. The CMOS transmission gate C3 transfers the output signal of the inverter I10 in response to the clock signal PCLK at a high level. The latch L3 inverts and latches the output signal of the CMOS transmission gate C4. The CMOS transmission gate C5 transfers the output signal of the latch L4 in response to the clock signal PCLK at a high level. The latch L5 inverts and latches the output signal of the CMOS transmission gate C5. The CMOS transmission gate C6 transfers the output signal of the latch L5 in response to the clock signal PCLK at a low level. The latch L6 inverts and latches the output signal of the CMOS transmission gate C6. The CMOS transmission gate C7 transfers the output signal of the latch L6 as the control signal PWA2 in response to the clock signal PCLK at a high level. Thus, the address control signal generator as shown in FIG. 3 generates the control signal PWA1 in response to the write command signal PWE while delaying the control signal PWA1 and generating the control signal PWA2 in response to the clock signal PCLK.

Figure 4:
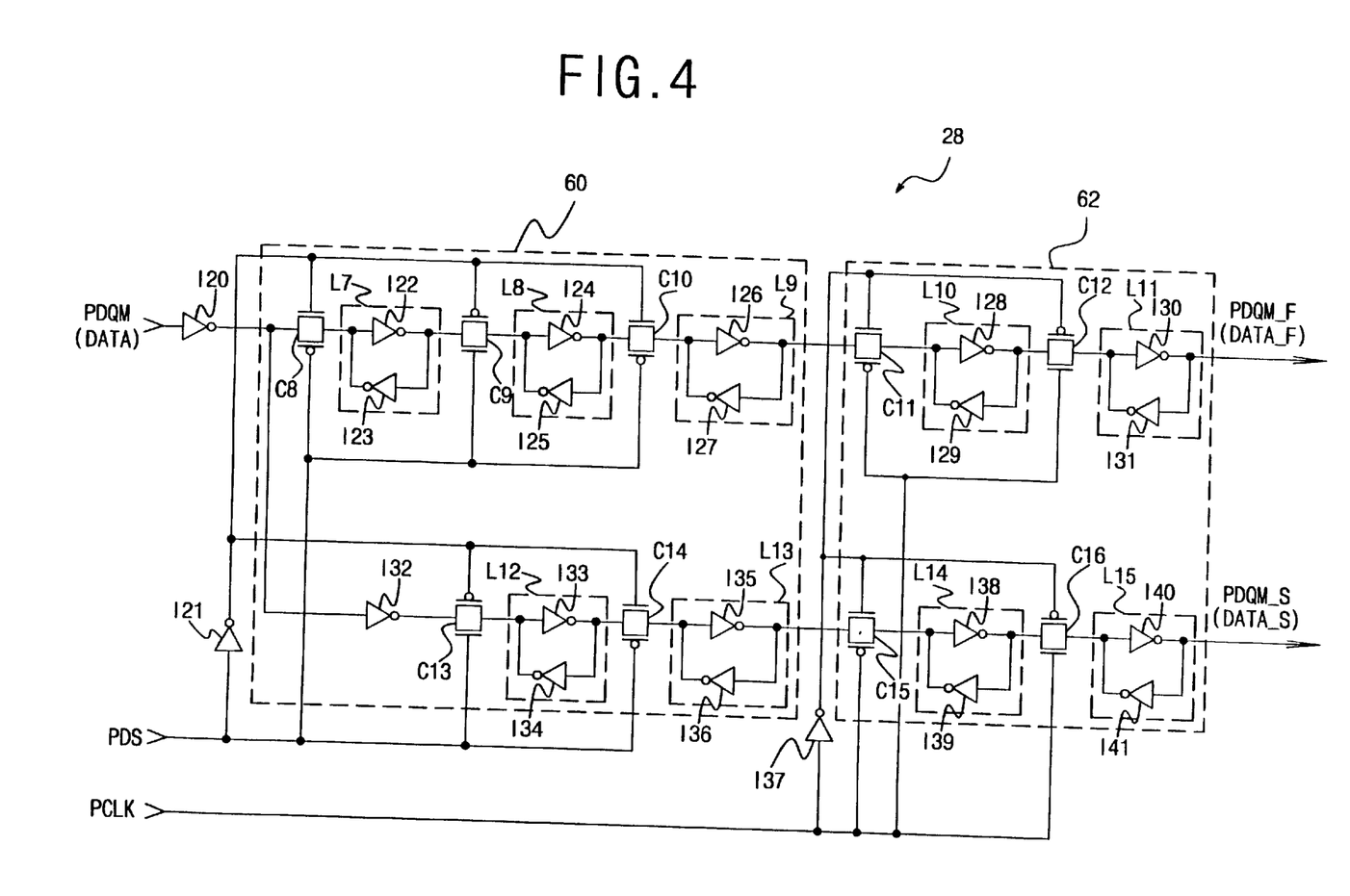
FIG. 4 is a schematic circuit diagram illustrating one embodiment of a PDQM_F and PDQM_S signal generator as shown in FIG. 1.

FIG. 4 contains a schematic block diagram of one embodiment of the PDQM_F, PDQM_S signal generator 28 of FIG. 1. The PDQM_F, PDQM_S signal generator includes a plurality of inverters I20, I21, I32, I37, a plurality of CMOS transmission gates C8, C9, C10, C11, C12, C13, C14, C15 and C16, a latch L7 composed of inverters I22 and I23, a latch L8 of inverters I24 and I25, a latch L9 of inverters I26 and I27, a latch L10 of inverter I28 and I29, a latch L11 of inverters I30 and I31, a latch L12 of inverters I33 and I34, a latch L13 of inverters I35 and I36, a latch L14 of inverter I38 and I39, and a latch L15 of inverters I40 and I41. The circuit of FIG. 4 comprises the circuit 60 for detecting the PDQM_F and PDQM_S signals in response to the data strobe signal PDS, and the circuit 62 for generating the PDQM_F and PDQM_S signals in response to the clock signal PCLK.

In operation, the inverter I20 inverts the masking control signal PDQM. The CMOS transmission gate C8 transfers the output signal of the inverter I20 in response to the data strobe signal PDS at a low level. The latch L7 inverts and latches the output signal of the CMOS transmission gate C8. The CMOS transmission gate C9 transfers the output signal of the latch L7 in response to the data strobe signal PDS at a high level. The latch L8 inverts and latches the output signal of the CMOS transmission gate C9. The CMOS transmission gate C10 transfers the output signal of the latch L8 in response to the data strobe signal PDS at a low level. The latch L9 inverts and latches the output signal of the CMOS transmission gate C10. Thus, the inverter I20, CMOS transmission gates C8, C9 and C10, and the latches L7, L8, L9 latch the masking control signal PDQM according to the data strobe signal PDS at a low level and transfers the latched masking control signal PDQM in response to the data strobe signal PDS at a high level.

The inverter I32 inverts the output signal of the inverter I20. The CMOS transmission gate C13 transfers the output signal of the inverter I32 in response to the data strobe signal PDS at a high level. The latch L12 inverts and latches the output signal of the CMOS transmission gate C12. The CMOS transmission gate C14 transfers the output signal of the latch L12 in response to the data strobe signal PDSD at a low level. The latch L13 inverts and latches the output signal of the CMOS transmission gate C14. Thus, the inverter I32, CMOS transmission gates C13 and C14, and latches L12 and L13 latch the masking control signal PDQM in response to the data strobe signal PDS at a high level and transfer the latched masking control signal PDQM in response to the data strobe signal PDS at a low level.

The CMOS transmission gate C11 transfers the output signal of the latch L26 in response to the clock signal PCLK at a low level. The latch L10 inverts and latches the output signal of the transmission gate C11. The CMOS transmission gate C12 transfers the output signal of the latch L10 in response to the clock signal at a high level. The latch L11 inverts and latches the output signal of the CMOS transmission gate C12 and generates the PDQM_F signal. Namely, the CMOS transmission gates C11 and C12 and latches L10 and L11 latch the output signal of the latch L9 in response to the clock signal PCLK at a low level and transfer the output signal of latch L11 as the PDQM_F signal in response to the clock signal PCLK at a high level.

The CMOS transmission gate C15 transfers the output signal of the latch L13 in response to the clock signal PCLK at a low level. The latch L14 inverts and latches the output signal of CMOS transmission gate C15. The CMOS transmission gate C16 transfers the output signal of the latch L14 in response to the clock signal PCLK at a high level. The latch L15 inverts and latches the output signal of the CMOS transmission gate C16, and generates the PDQM_S signal. Thus, the CMOS transmission gates C15 and C16 and latches L14 and L15 latch the output signal of the latch L13 in response to the clock signal PCLK at a low level and transfer the output signal of latch L11 as the PDQM_S signal in response to the clock signal PCLK at a high level.

The circuit of FIG. 4 delays the PDQM signal by one clock period in response to the data strobe signal PDS at a low level, and latches the delayed signal PDQM in response to the clock signal at a low level and generates the latched signal PDQM as the PDQM_F signal in response to the clock signal at a high level. In addition, it latches the masking control signal PDQM in response to the data strobe signal PDS at a high level and transfers the latched signal PDQM in response to the data strobe signal at a low level. It also latches the latched signal PDQM in response to the clock signal PCLK at a low level and transfers the latched signal PDQM as the PDQM_S signal in response to the clock signal PCLK at a high level. The PDATA_F, PDATA_S signal generator 32 shown in FIG. 1 has substantially the same structure as the PDQM_F/PDQM_S signal generator 28 as shown in FIG. 4 and described above. That is, the PDATA_F, PDATA_S signal generator 32 transfers the data inputted at a low level of the data strobe signal PDS as the PDATA_F signal in response to the clock signal, and the data inputted at a high level of the data strobe signal PDS as the PDATA_S signal in response to the clock signal. It also generates the PDATA_F and PDATA_S signal as the PDATA_E and PDATA_O signal respectively in response to the column address CA1.

Figure 5:
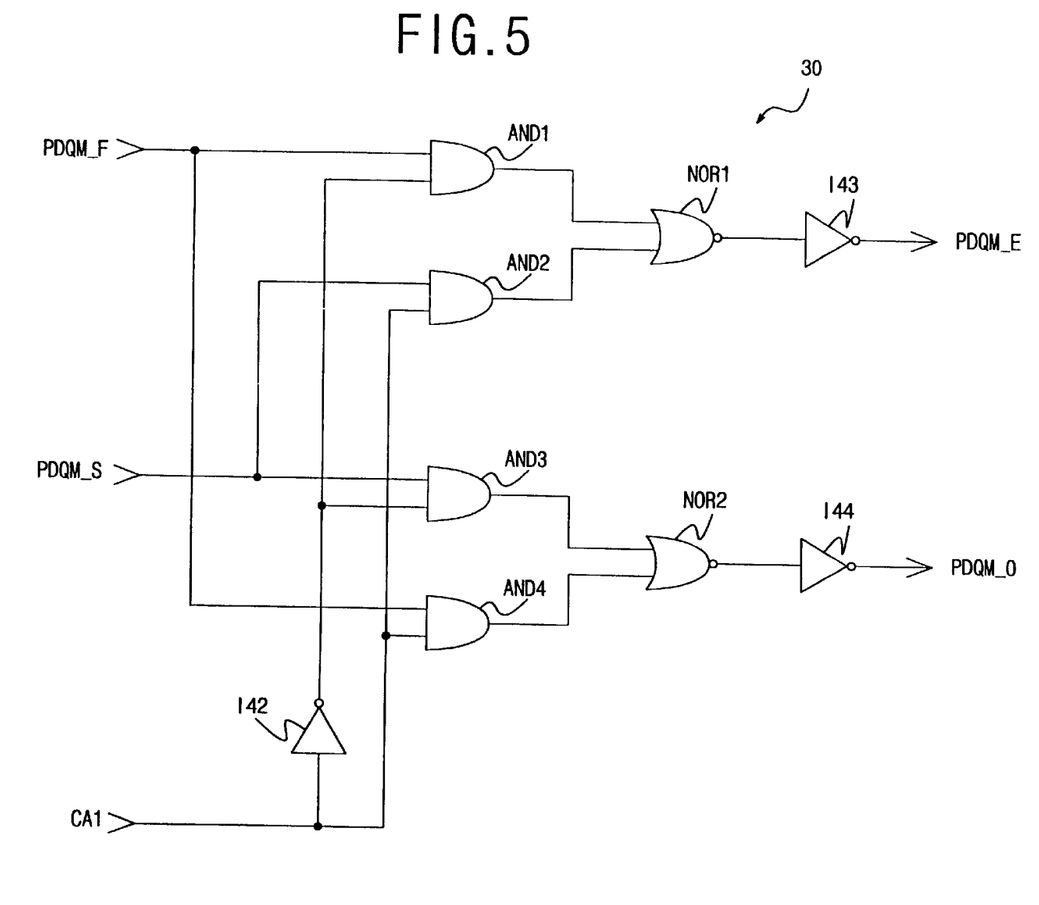
FIG. 5 is a schematic circuit diagram for illustrating one embodiment of a PDQM_E and PDQM_O signal generator as shown in FIG. 1.

FIG. 5 contains a schematic block diagram of one embodiment of the PDQM_E/PDQM_signal generator 30 of FIG. 1 includes inverters I42, I43 and I44, AND gates AND1, AND2, AND3 and AND4, and NOR gates NOR1 and NOR2. In operation, the AND gates AND1 and AND3 generate the PDQM_F and PDQM_S signals, respectively, in response to the column address signal CA1 at a low level. The AND gates AND2 and AND4 generate the PDQM_S and PDQM_F signals, respectively, in response to the column address signal CA1 at a high level. Subsequently, the NOR gate NOR1 and inverter I43 perform ORing of the output signals of the AND gates AND1 and AND2 and generate the output signal of inverter I43 as the PDQM_E signal. The NOR gate NOR2 and inverter I44 perform ORing of the output signals of the AND gates AND3 and AND4 and to generate the output signal of inverter I44 as the PDQM_O signal. Thus, the circuit of FIG. 5 generates the signals PDQM_F and PDQM_S as the signals PDQM_E and PDQM_O, respectively, in the case in which the column address signal CA1 is at a low level, and generates them as the signals PDQM_O, and PDQM_E in the case in which the column address signal CA1 at a high level.

Figure 6:
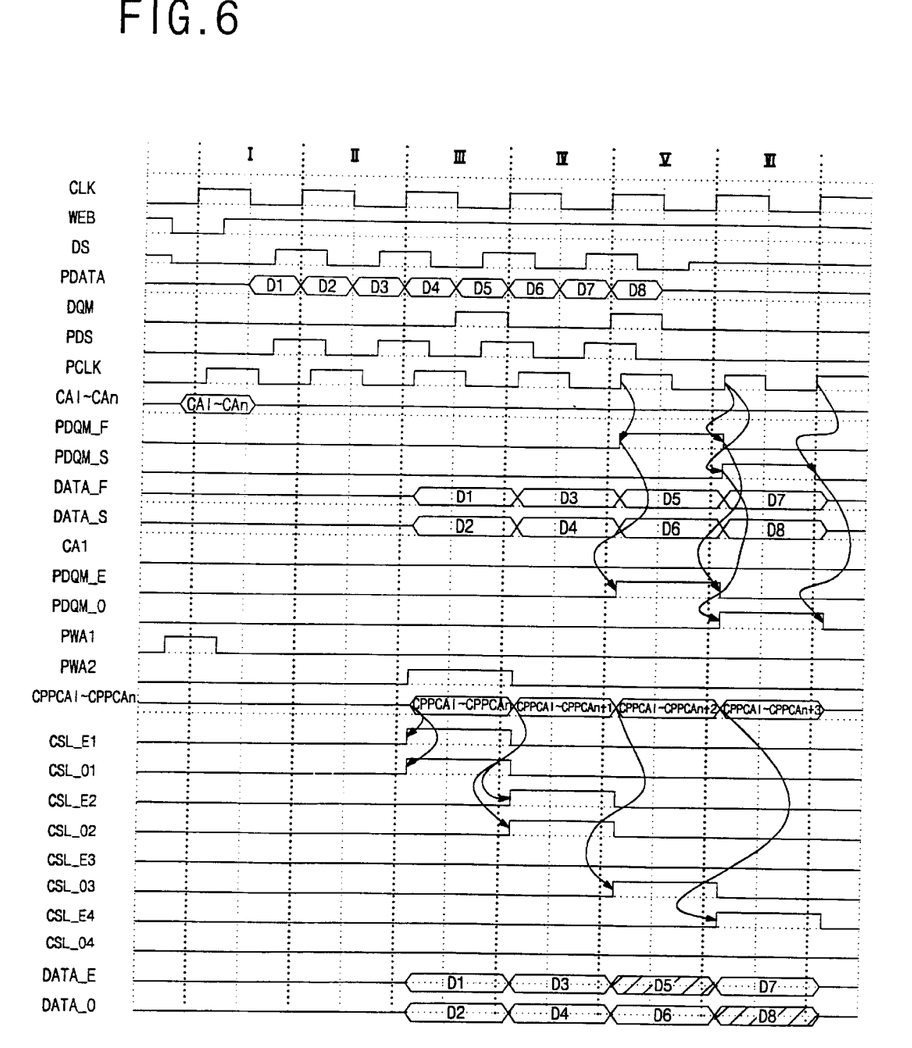
FIGS. 6 and 7 are timing diagrams illustrating masking memory cells from unwanted data writing in accordance with the invention.

FIG. 6 is a timing diagram which illustrates the write data masking operation of one embodiment of a semiconductor memory device of the present invention, in the case in which the burst length is 8 and write data D5, D8 is masked. The inverted write command WEB is applied at the rising edge of the clock signal CLK, and thereafter, the data strobe signal DS becomes high during the low-level interval of the clock signal CLK. The signal DS has the same period as the clock signal CLK and repeats half as many times as the burst length. That is, as shown in FIG. 6, the data strobe signal DS is generated four times. Meanwhile, the data D1~D8 are successively inputted at the rising and falling edges of the data strobe signal DS and the first address CA1~CAn is inputted simultaneously with the input of the inverted write command. Because the timing diagram of FIG. 6 shows the operation for preventing the data D5 and D8 from being written, the masking control signal DQM is applied when inputting the data D5 and D8. In addition, the timing diagram of FIG. 6 shows the address counter 26 which generates the burst column address increased one by one.

Hereinafter, the write data masking operation of the inventive memory device will be more specifically described according to the clock cycle when inputting the signals CLK, WEB, DS, DQ, DQM, CCA1~CAn.

During the first cycle (I), the control signal PWA1 is generated with the inverted write command WEB. At the second cycle (II), the buffered masking control signal PDQM and buffered data PDATA are latched by the PDQM_F, PDQM_S signal generator 28 and PDATA_F/PDATA_S signal generator 32, respectively, in response to the buffered data strobe signal PDS, and output in response to the buffered clock signal PCLK.

At the third cycle (III), the PDATA_F, PDATA_S signal generator 32 generates data D1 as the PDATA_F signal and data D2 as the PDATA_S. Since the column address signal CA1 is at low level, the PDATA_E/PDATA_O signal generator 34 generates the PDATA_F and PDATA_S signals as the PDATA_E and PDATA_O signals, respectively. The address control signal generator 24 generates the control signal PWA2, and the external address latched in the address register 22 is generated as the address CPPCA1~CPPCAn for selecting the first column selection signals CSL_E, CSL_O in response to the control signal PWA2. The PDQM_F, PDQM_S signal generator 28 generates the PDQM_F and PDQM_S signals, respectively, at a low level while the PDQM_E, PDQM_O signal generator 30 generates the PDQM_E and PDQM_O signals, respectively, at a low level. Since both PDQM_E and PDQM_O signal are at low levels, the even numbered and odd numbered column decoder 36 decodes the address CPPCA1~CPPCAn and generates the column selection signals CSL_E1 and CSL_O1, respectively. Hence, data D1 and D2 are written into the even and odd numbered memory cell array blocks, respectively, in response to the column selection signals.

At the fourth cycle (IV), data D3 and D4 are written into the even and odd numbered memory cell array blocks, respectively, by performing the same operation as at the third cycle (III). In this case, the internal address generator 27 increases the address and generates the increased address (CPPCA1~CPPCAn)+1, and the even and odd numbered column decoder 36 enables the second column selection signals CSL_E2 and CSL_O2 in response to the address (CPPCA1~CPPCAn)+1.

At the fifth cycle (V), the PDQM_F, PDQM_S signal generator 28 generates the PDQM_F signal at a high level and PDQM_S signal at a low level while the PDQM_E, PDQM_O signal generator 30 generates the PDQM_E signal at a high level and PDQM_O signal at a low level in response to the column address CA1 at a low level. The internal address generator 27 generates the addresses (CPPCA1~CPPCAn)+2, so that the even numbered column decoder is disabled to prevent the generation of the column selection signal CSL_E3, and the odd numbered decoder generates the column selection signal CSL_O3. Hence, the data D5 inputted to the even numbered memory cell array block is masked while the data D6 inputted to the odd numbered memory cell array block is written. In the timing diagram, the masked data D5 prevented from being written is indicated by shading lines.

At sixth cycle (VI), the PDQM_F, PDQM_S signal generator 28 generates the PDQM_F signal at a low level and PDQM_S signal at a high level while the PDQM_E/PDQM_O signal generator 30 generates the PDQM_E signal at a low level and PDQM_O signal at a high level in response to the column address CA1 at a low level. The internal address generator 27 generates the address (CPPCA1~CPPCAn)+3, so that the even numbered column decoder generates the column selection signal CSL_E4, and the odd numbered decoder is disabled, thus not generating the column selection signal CSL_O4. Hence, the data D7 inputted to the even numbered memory cell array block is written, and the data D8 inputted to the odd numbered memory cell array block is prevented from being written. In the timing diagram, the data D8 prevented from being written is indicated by shading lines.

Figure 7:
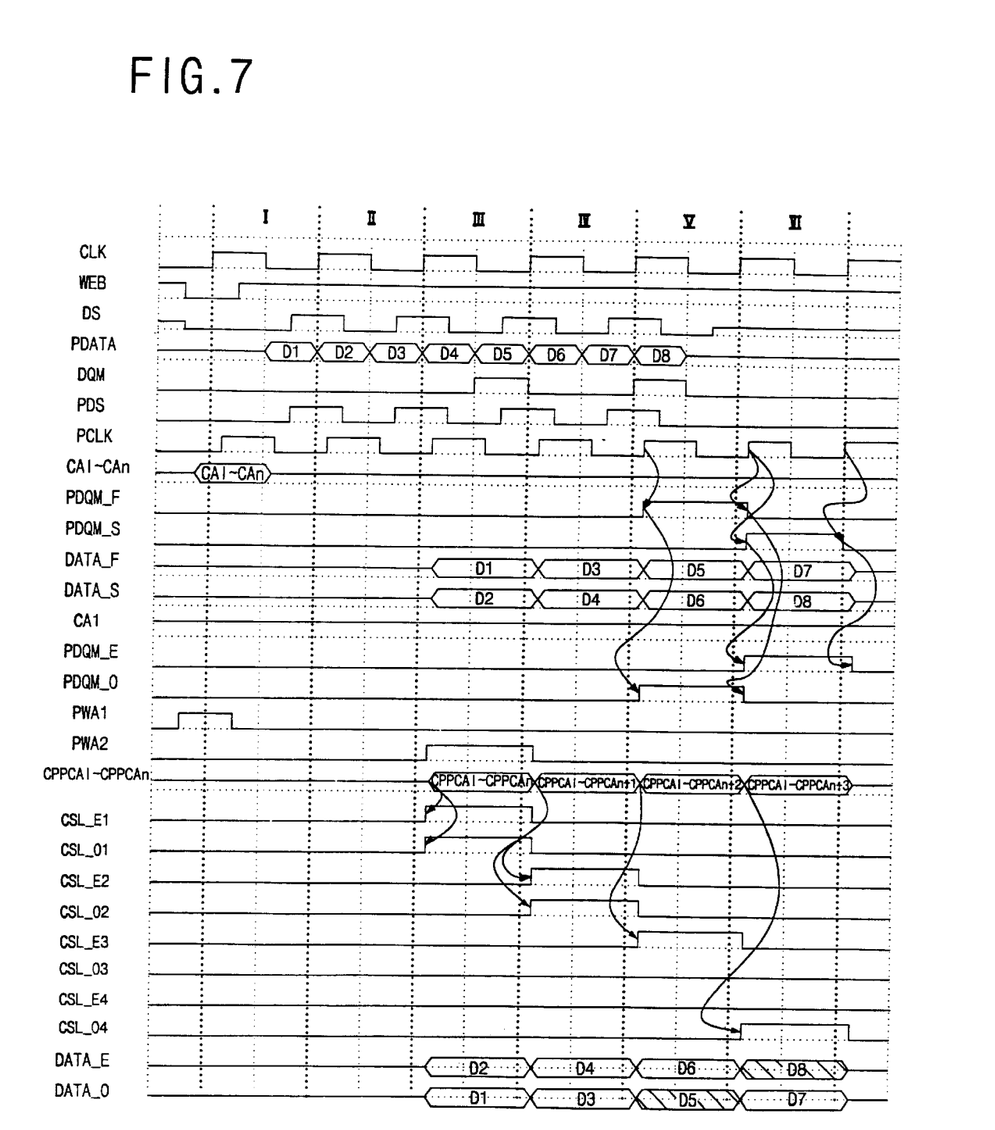

FIG. 7 is a timing diagram similar to FIG. 6, but with the column address CA1 shown at a high level. Since the column address CA1 is at a high level, the PDQM_E, PDQM_O signal generator 30 generates the PDQM_F and PDQM_S signals as the PDQM_O and PDQM_E signals, respectively, while the PDATA_E/PDATA_O signal generator 34 transfers the PDATA_F and PDATA_S signals as the PDATA_O and PDATA_E signals, respectively. Hence, the data D2, D4, D6 are written into the even numbered memory cell array block while the data D8 is prevented from being written. In addition, the data D1, D3, D7 are written into the odd numbered memory cell array block while the data D5 is prevented from being written.

Thus, the invention provides a semiconductor memory device which generates externally inputted masking control signal as the first and second masking control signals that is synchronized with the data strobe signal, and outputs orderly and reversely the first and second masking control signals according to the externally inputted column address signal. Accordingly, the invention can selectively mask the data inputted to even numbered or odd numbered memory cell array block.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor memory device comprising:
   a memory cell array having even and odd numbered memory cell array blocks for storing first and second data sets, respectively, in response to even and odd numbered column selection signals, respectively;

an address generator for generating a column address in response to a column address of multiple bits;

an even and an odd numbered column decoder for decoding said column address and generating said even and odd numbered column selection signals, respectively, in response to a first and a second masking control signal, respectively;

a third and a fourth masking control signal generator for latching a primary masking control signal in response to data strobe signals of first and second states, respectively, and generating a third and a fourth masking control signal, respectively, in response to a clock signal;

a third and a fourth data generator for latching input data in response to the data strobe signals of said first and second states, respectively, and generating a third and a fourth data set in response to said clock signal;

a first and a second masking control signal generator for generating said third and fourth masking control signals, respectively, as said first and second masking control signals, respectively, in response to a predetermined address of a first state, and said fourth and third masking control signals, as said first and second masking control signals, respectively, in response to a predetermined address of a second state; and a first and a second data generator for generating said third and fourth data sets as said first and second data sets in response to a predetermined address signal of a first state, and said fourth and third data sets as said first and second data sets in response to a predetermined address signal of a second state.

2. A semiconductor memory device as defined in claim 1, wherein said input data is input at both rising and falling edges of said data strobe signal.

3. A semiconductor memory device as defined in claim 1, wherein said third and fourth masking control signal generator comprises:

a first circuit for latching said masking control signal in response to said data strobe signal of the first state;

a second circuit for latching said masking control signal in response to said data strobe signal of the second state and transmitting the latched masking control signal in response to said data strobe signal of the first state;

a third masking control signal transfer circuit for latching the output of said first circuit in response to said clock signal of the first state and transmitting the latched data as said third masking control signal in response to said clock signal of the second state; and a fourth masking control signal transfer circuit for latching the output of said second circuit in response to said clock signal of the first state and transmitting the latched data as said fourth masking control signal in response to said clock signal of the second state.

4. A semiconductor memory device as defined in claim 3, wherein said first circuit comprises:

a first CMOS transmission gate for transmitting the inverted signal of said masking control signal in response to said data strobe signal of the first state;

a first latch for inverting and latching the output signal of said first CMOS transmission gate;

a second CMOS transmission gate for transmitting the output signal of said first latch in response to said data strobe signal of the second state;

a second latch for inverting and latching the output signal of said second CMOS transmission gate;

a third CMOS transmission gate for transmitting the output of said second latch in response to said data strobe signal of the first state; and a third latch for inverting and latching the output signal of said third CMOS transmission gate.

5. A semiconductor memory device as defined in claim 3, wherein said second circuit comprises:

a fourth CMOS transmission gate for transmitting said masking control signal in response to said data strobe signal of the second state;

a fourth latch for inverting and latching the output of said fourth CMOS transmission gate;

a fifth CMOS transmission gate for transmitting the output of said fourth latch in response to said data strobe signal of the first state; and a fifth latch for inverting and latching the output of said fifth CMOS transmission gate.

6. A semiconductor memory device as defined in claim 4, wherein said third masking control signal transfer circuit comprises:

a sixth CMOS transmission gate for transmitting the output of said third latch in response to said clock signal of the first state;

a sixth latch for inverting and latching the output of said sixth CMOS transmission gate;

a seventh CMOS transmission gate for transmitting the output of said sixth latch in response to said clock signal of the second state; and a seventh latch for inverting and latching the output of said seventh CMOS transmission gate.

7. A semiconductor memory device as defined in claim 5, wherein said fourth masking control signal transfer circuit comprises:

an eighth CMOS transmission gate for transmitting the output of said fifth latch in response to said clock signal of the first state;

an eighth latch for inverting and latching the output of said eighth CMOS transmission gate;

a ninth CMOS transmission gate for transmitting the output of said eighth latch in response to said clock signal of the second state; and a ninth latch for inverting and latching the output of said ninth CMOS transmission gate.

8. A semiconductor memory device as defined in claim 1, wherein said third and fourth data generator comprises:

a third circuit for latching said input data in response to said data strobe signal of the first state;

a fourth circuit for latching said input data in response to said data strobe signal of the second state and generating the latched input data in response to said data strobe signal of the first state;

a third data transfer circuit for latching the output signal of said third circuit in response to said clock signal of the first state and transmitting the latched data as said third data; and a fourth data transfer circuit for latching the output signal of said fourth circuit in response to said clock signal of the first state and transmitting the latched data as said fourth data.

9. A semiconductor memory device comprising:

a memory cell array having even and odd numbered memory cell array blocks for storing a first and a second data sets, respectively in response to respective even and odd numbered column selection signals, respectively;

an address generator for generating a column address in response to column addresses of multiple bits;

an even and an odd numbered column decoder for decoding said column address and generating said even and odd numbered column selection signals, respectively, in response to a first and a second masking control signal, respectively;

a first and a second masking control signal generator for latching a masking control signal in response to data strobe signals of first and second states, respectively, and generating a third and a fourth masking control signals, respectively, in response to a clock signal as a first and a second signal, respectively, or a second and a first signal, respectively, in response to said column address signal; and a first and a second data generator for latching the input data in response to the data strobe signals of said first and second states, respectively, and generating a third and a fourth data, respectively, in response to said clock signal as a first and a second signal, respectively, or a second and a first signal, respectively, in response to said column address signal.

10. A semiconductor memory device as defined in claim 9, wherein said first and second masking control signal generators comprises:

a first circuit for latching said masking control signal in response to said data strobe signal of the first state;

a second circuit for latching said masking control signal in response to said data strobe signal of the second state and transmitting the latched masking control signal in response to said data strobe signal of the first state;

a third masking control signal transfer circuit for latching the output of said first circuit in response to said clock signal of the first state and transmitting the latched data as said third masking control signal in response to said clock signal of the second state;

a fourth masking control signal transfer circuit for latching the output of said second circuit in response to said clock signal of the first state and transmitting the latched data as said fourth masking control signal in response to said clock signal of the second state; and a first and a second masking control signal generator for generating said third and fourth masking control signals, respectively, as said first and second masking control signals, respectively, in response to said column address of first state, or said fourth and third masking control signals, respectively, as said first and second masking control signals, respectively, according to a column address of second state.

11. A semiconductor memory device as defined in claim 9, wherein said first and second data generators comprises:

a third circuit for latching said input data in response to said data strobe signal of the first state;

a fourth circuit for latching said input data in response to said data strobe signal of the second state and generating the latched input data in response to said data strobe signal of the first state;

a third data transfer circuit for latching the output signal of said third circuit in response to said clock signal of the first state to transmit the latched data as said third data in response to said clock signal of the second state;

a fourth data transfer circuit for latching the output signal of said fourth circuit in response to said clock signal of the first state to transmit the latched data as said fourth data in response to said clock signal of the second state; and a first and a second data transfer circuit for delivering said third and fourth data as said first and second data, respectively, in response to said column address of first state, or as said second and first data, respectively, in response to said column address of the second state.

12. A write data masking method of a semiconductor memory device, said semiconductor memory device having a memory cell array having even and an odd numbered memory cell array blocks for storing a first and a second data set, respectively, according to even and odd numbered column selection signals, respectively, an address generator for generating a column address in response to a column address of multiple bits, and an even and an odd numbered column decoder for decoding said column address and generating said even and odd numbered column selection signals, respectively, in response to a first and a second masking control signals, said method comprising:

receiving a primary masking control signal in response to said data strobe signal of the first state or second state and generating a third or fourth masking control signal, respectively, in response to a clock signal while receiving the input data in response to said data strobe signal of first or second state to generate a third or fourth data, respectively, in response to said clock signal; and generating said third and fourth masking control signals as said first and second masking control signals, respectively, or second and first masking control signals, respectively, in response to said column address while generating said third and fourth data, respectively, as said first and second data, respectively, or second and first data, respectively, in response to said column address.

* * * * *